(12) United States Patent
Chen et al.

(10) Patent No.: US 8,108,821 B2
(45) Date of Patent: Jan. 31, 2012

(54) REDUCTION OF LOGIC AND DELAY THROUGH LATCH POLARITY INVERSION

(75) Inventors: Jonathan Y. Chen, Poughkeepsie, NY (US); Jose L. Neves, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/685,803

(22) Filed: Jan. 12, 2010

(65) Prior Publication Data

US 2011/0173584 A1    Jul. 14, 2011

(51) Int. Cl.
G06F 9/455    (2006.01)
G06F 17/50    (2006.01)

(52) U.S. Cl. ........ 716/134; 716/108; 716/113; 716/132; 716/133; 716/135

(58) Field of Classification Search .......... 716/106–108, 716/111, 113, 132–135
See application file for complete search history.

(56) References Cited

U.S. PATENT DOCUMENTS

| | | |
|---|---|---|
| 5,335,207 A | 8/1994 | Takamoto |
| 5,644,498 A | 7/1997 | Joly et al. |
| 6,075,931 A | 6/2000 | Panwar |
| 6,260,185 B1 | 7/2001 | Sasaki et al. |
| 6,345,378 B1 | 2/2002 | Joly et al. |
| 6,377,912 B1 | 4/2002 | Sample et al. |
| 2003/0226122 A1 | 12/2003 | Hathaway et al. |
| 2006/0095879 A1* | 5/2006 | Brahme et al. ............. 716/6 |
| 2007/0089074 A1* | 4/2007 | Ramachandran et al. ...... 716/2 |
| 2009/0293033 A1* | 11/2009 | Ito ............................. 716/6 |

FOREIGN PATENT DOCUMENTS

JP    06045444    2/1994

* cited by examiner

*Primary Examiner* — Paul Dinh
*Assistant Examiner* — Nha Nguyen
(74) *Attorney, Agent, or Firm* — Cantor Colburn LLP; William A. Kinnaman, Jr.

(57) ABSTRACT

A method for reducing logic and delay within a logic structure that includes searching logic structures to be analyzed, finding a plurality of latches within a logic structure to be analyzed, determining if any respective latches of the plurality of latches have sufficiently positive slack within an input and output path thereof and optionally excluding the respective latches from being analyzed, determining if there is at least one remaining latch to be analyzed, and determining whether inverters are disposed within an input path and an output path of the at least one remaining latch. The method further includes obtaining logic functions of the input path and output path of the at least one remaining latch when inverters are found, modifying the logic functions using DeMorgan's Theorems, determining whether timing violations exist with the modified logic functions, and annotating hardware description language based on the modified logic functions when no timing violations exist.

23 Claims, 7 Drawing Sheets

REDUCTION OF LOGIC AND DELAY THROUGH LATCH POLARITY INVERSION

BACKGROUND

The present invention relates generally to integrated circuits, and more specifically, to a method of automation of logic synthesis and implementation for reducing logic and delay through latch polarity inversion.

In synchronous logic designs, latches or flip-flops are the sequential blocks that synchronize the logic flow. Due to the complexity of logic designs, the logic flows are written in hardware description languages (HDL) such as very-high-speed integrated circuit "VHSIC" (VHDL), and then synthesized into digital logic circuits. The synthesis process includes inserting logic between the latches to implement logic functions using inverters and/or other logic gates. A combinational synthesis process is repeated for all logic functions within the design. The signal polarity of each logic function is correctly implemented within the latch boundaries however maintaining signal polarity across latch boundaries may lead to inefficient use of inverters and/or logic gates, thereby causing extra path delay and circuit power.

SUMMARY

The present invention provides a method of analyzing a synthesized design and improving the handling of cross latch polarity by removing and/or re-synthesizing gates before and after a latch such that the function logic stays the same while reducing the number of logic gates, path delay and circuit power.

The present invention automatically searches through the synthesized logic to identify patterns of logic that can be implemented by a reduced number of inverters, logic gates and latches in reversed polarity. Based on the results of the search, the following on step can be applied to remove the extra logic (i.e., optionally excluding some latch paths). The present invention also provided a method of physical design changes to meet the cycle time and slew requirements, the algorithm of automatic back annotation which including writing back a file that describes the modified latch structure, the latch polarity changes to the designs in HDL, as well as a re-synthesizing the logic using the back-annotated HDL thus eliminating the need for extra logic gates.

According to one embodiment of the present invention, a method for reducing logic and delay within a logic structure is provided. The method includes searching logic structures to be analyzed, finding a plurality of latches within a logic structure to be analyzed, determining if any respective latches of the plurality of latches have sufficiently positive slack within an input and output path thereof and optionally excluding the respective latches from being analyzed, and determining if there is at least one remaining latch to be analyzed. The method further includes determining whether inverters are disposed within an input path and an output path of the at least one remaining latch, obtaining logic functions of the input path and output path of the at least one remaining latch when inverters are found, modifying the logic functions using DeMorgan's Theorems, determining whether timing violations exist with the modified logic functions, and annotating hardware description language based on the modified logic functions when no timing violations exist.

A computer program product capable of performing the above-mentioned method is also provided.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

According to an embodiment of the present invention, a method for reducing logic and delay within a logic structure is provided where a logic structure is analyzed and changes may be made to a selected logic structure based on DeMorgan's Theorems to reduce the number of inverters, logic gates and/or latches in reversed polarity Reversed polarity in binary/Boolean logic means to invert the binary value, for example, the reversed polarity of logic "1" means logic "0" and vice versa. According to an embodiment of the present invention, logic represents a sequence of connected logic gates with or without inverters in between the logic gates as obtained from logic synthesis. A level within logic represents one logic gate. DeMorgan's Theorems indicate that any logical binary expression remains unchanged if changes are made such that all variables are changed to their complements, all AND operations are changed to OR operations or vice versa and by taking the complement of the entire logic expression. According to the present invention, an existing logic structure that has completed logic synthesis, placement and routing is provided. It is assumed that the logic structure meets all timing requirements except for slack. That is, there are no slew violations on any of the signals within the logic structure. Slack is defined as "required arrival time minus actual arrival time" in circuit delay. A logic structure fails to meet slack when a delay on a path between any two latches of the logic structure is higher than desired for that path. Therefore, a positive or more slack is better than less slack. Thus, the method according to an embodiment of the present invention reduces the path delay through logic redesign around a latch including latch inversion as mentioned above. Therefore, the path(s) delay(s) before and after a latch are reduced through logic simplification such that new gates have less delay than the existing implementation of the logic structure.

Figure 1:
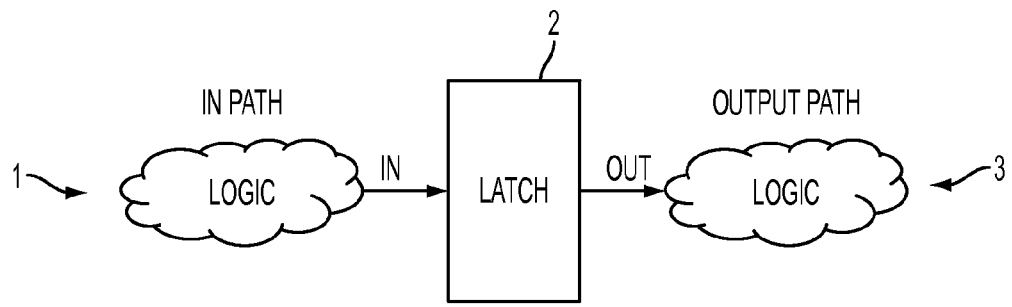
FIG. 1 is a diagram illustrating an input path and output path of a latch within a logic structure that can be implemented within embodiments of the present invention.
Figure 2:
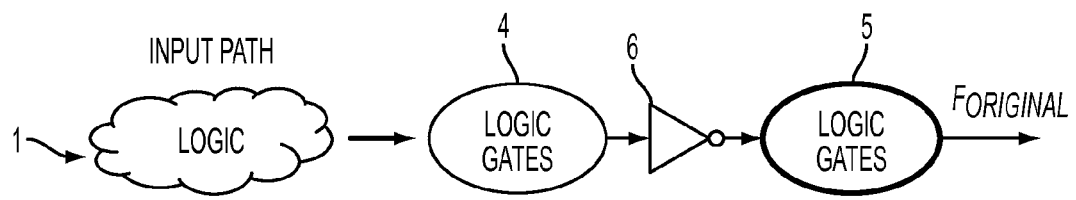
FIG. 2 is a diagram illustrating an example of the input path shown in FIG. 1 that can be implemented within alternative embodiments of the present invention.
Figure 3:
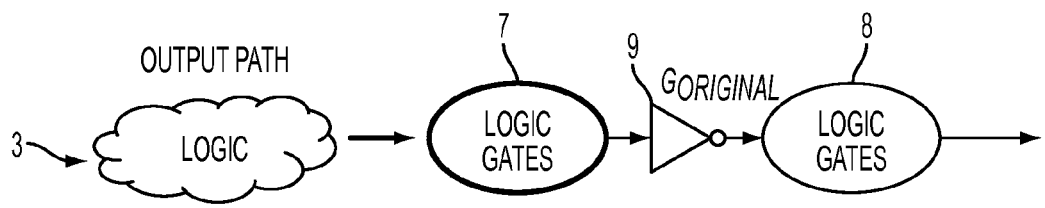
FIG. 3 is a diagram illustrating an example of the output path shown in FIG. 1 that can be implemented within alternative embodiments of the present invention.

FIG. 1 is a diagram illustrating an input and output path of a latch within a logic structure that can be implemented within an embodiment of the present invention. As shown in FIG. 1, the input path 1 includes logic at an input of a latch 2 and an output path 3 including logic is disposed at an output of the latch 2. FIG. 2 is a diagram illustrating an example of the input path shown in FIG. 1 that can be implemented within embodiments of the present invention. FIG. 3 is a diagram illustrating an example of the output path shown in FIG. 1 that can be implemented within embodiments of the present invention.

As shown in FIG. 2, the input path 1 includes logic gates 4 and 5 and an inverter 6 disposed between the logic gates 4 and 5. As shown in FIG. 3, the output path 3 includes logic gates 7 and 8 and an inverter 9 disposed between the logic gates 7 and 8.

According to an embodiment of the present invention, the logic function at the input path 1 and the logic function at the output path 3 can be changed based on DeMorgan's Theorems in the case of an inverted latch. Further, all of the logic gates are placed and physically connected. Additional details regarding the input and output paths 1 and 3 will be described below with reference to the method for reducing logic and delay in a logic structure shown in the flowchart in FIG. 4.

Figure 4:
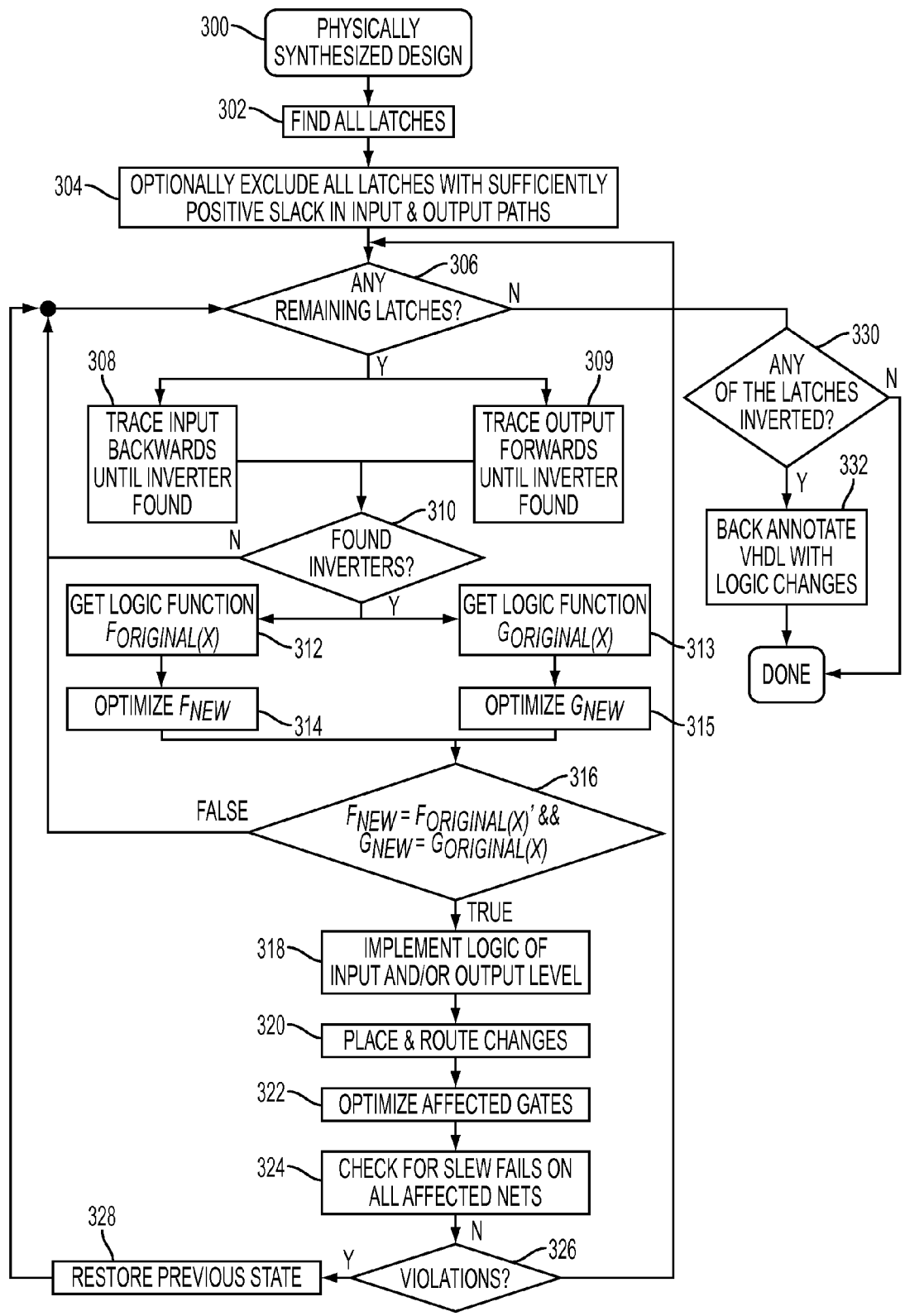
FIG. 4 is a flowchart illustrating a method for reducing logic and delay within a logic structure that can be implemented within embodiments of the present invention.

FIG. 4 is a flowchart illustrating a method for reducing logic and delay within a logic structure that can be implemented within embodiments of the present invention. As shown in FIG. 4, in operation 300, a logic structure to be analyzed is provided. From operation 300, the process moves to operation 302 where a plurality of latches within the logic structure are found. That is, according to an embodiment of the present invention, all of the latches within the logic structure are found. From operation 302, the process moves to operation 304 where it is determined whether any latches of the plurality of latches found have sufficiently positive slack in an input path and output path of the latch since these latches already meet the timing constraints. Upon determination, the specified latches having positive slack in both input and output paths are optionally excluded from analysis. From operation 304, the process moves to operation 306, where it is determined whether there are any remaining latches to be analyzed. At operation 306, if it is determined that there is at least one remaining latch, the process continues to operations 308 and 309 where the at least one remaining latch is analyzed. According to an embodiment of the present invention, each remaining latch is analyzed one at a time, until there are no remaining latches to be analyzed. According to an embodiment of the present invention, the remaining latches may be ordered based on an amount of slack, for example, starting with the latch having the worst slack.

At operation 308, an input path of the remaining latch is traced backwards from the input at the latch to find any inverters. In operation 309, an output path of the remaining latch is traced forward from the output at the latch to find any inverters. According to an embodiment of the present invention, the operations performed in operations 308 and 309 are independent tasks which may be performed simultaneously or sequentially. From operations 308 and 309, the process moves to operation 310, where it is determined whether any inverters are found. If it is determined that no inverters are found in operation 310, the process returns to operation 306 to determine whether there are any remaining latches to be analyzed and the process begins again if it is determined in operation 306 that there is at least one remaining latch to be analyzed. On the other hand, when it is determined that inverters are found in operation 310, the process moves to operations 312 and 313 where the logic functions at the input (e.g., $F_{original}(x)$) and output (e.g., $G_{original}(x)$) of the remaining latch are obtained.

Referring back to FIGS. 2 and 3, as shown in FIG. 2, $F_{original}$ refers to the logic function from the input of the inverter 6 through the logic gates 5 at the input path 1 to the input at the latch 2 (e.g., a latch being analyzed). As shown in FIG. 3, the $G_{original}$ refers to logic function from the output of the latch 2 (e.g., a latch being analyzed) through the logic gates 7 to the output of the inverter 9 of the same latch 2. Referring back to FIG. 4, from operations 312 and 313 the process moves to operations 314 and 315.

According to an embodiment of the present invention, operations 312 and 313 are independent tasks which may be performed simultaneously or sequentially similar to that of operations 308 and 309. Similarly, operations 314 and 315 may also be performed simultaneously or sequentially. In operation 314, the logic function at the input (i.e., $F_{original}(x)$) is optimized using DeMorgan's Theorems where the complement $F_{new}=F_{original}(x)'$ of the $F_{original}(x)$ is obtained. That is, the new (i.e., modified) logic function $F_{new}$ is the complement of the existing logic function. According to an embodiment of the present invention, the total gate delay of $F_{new}$ is less than that of $F_{original}(x)$. In operation 315, the logic function at the output (i.e., $G_{original}(x)$) is optimized using DeMorgan's Theorems where the new (i.e., modified) logic function (i.e., $G_{new}$) at the output of the inverter 9 (as depicted in FIG. 3) considering that the output of the latch is now inverted. According to an embodiment of the present invention, the logic function $G_{new}=G_{original}$; therefore, this logic function remains the same as before optimization. From operations 314 and 315, the process moves to operation 316, where it is determined whether the new logic function at the input is equal to the complement of the original logic function at the input and whether the new logic function at the output is equal to the original logic function at the output. If it is determined that one or both cases are false in operation 316, process returns to operation 306 where it is determined whether there is another remaining latch to be analyzed. If it is determined that there is a remaining latch the process begins to analyze the remaining latch. If it is determined that both cases are true in operation 316, the process moves to operation 318 where it is determined whether the physical implementation of the new logic functions at the input and output paths meet desired specifications. From operation 318, the process moves to operation 320 where the previous logic functions at the input and output of the latch are removed.

Next, a determination of placement position is made based on a bounding box of the input and output pins of a gate to be placed. According to an embodiment of the present invention, the gate is placed in a nearest location of a center of the bounding box. According to an embodiment of the present invention, this process is automatically repeated starting with the gates directly connecting to the latch and tracing backwards and forwards on the gates of the new logic function until the input and output of the latch are reached and the new logic functions are inputted, routed and connected. From operation 320, the process moves to operation 322 where affected gates may be optimized due to physical properties of the new logic functions. According to an embodiment of the present invention, optimization of the new gates includes adjusting a power level of the new gates to adjust the sizes thereof based on the new logic functions. From operation 322, the process moves to operation 324 where it is determined whether there are any slew failures on all affected signals. From operation 324, the process moves to operation 326 where it is determined whether there are any timing violations. In operation 326, testing is performed to determine whether there are any timing violations. If it is determined that there are timing violations in operation 326 the process moves to operation 328 where the previous state of the latch within the logic structure is restored in both the input path and output path. According to an embodiment of the present invention, the restoration of the state of the latch includes bringing the original gates into their original places and restoring the original routes. From operation 328, the process returns to operation 306 where it is determined whether there is a remaining latch to be analyzed.

On the other hand, if it is determined that there are no timing violations, the process returns back to operation 306, to determine if there are any remaining latches to be analyzed. If it is determined that there is at least one remaining latch to be analyzed, the process begins again at operations 308 and 309. If it is determined that there are no more remaining latches to be analyzed in operation 306, the process moves to operation 330 where it is determined whether any of the latches in the logic structure have been inverted. If it is determined that any of the latches have been inverted, the process moves to operation 332, the VHDL is back annotated with the logic changes made. That is, after all latches of the critical latches have been visited, the latches inverted due to optimization are identified. According to an embodiment of the present invention, a VHDL description of the inverted latches is created and merged back into the original VHDL description of the logic structure analyzed. The new VHDL will drive logic simulation to create new test patterns for testing the logic structure and tools that perform design checking between layout implementations and the logic structure description. According to another embodiment, a resynthesizing operation may be performed where the logic is resynthesized using back-annotated HDL thus using the back-annotated HDL as an input for logic synthesis again instead of modifying the already synthesized logic.

According to an embodiment of the present invention, the method performed within the flowchart shown in FIG. 4, is not limited to the operations being performed in any particular order and may be varied accordingly. For example, according to an alternative embodiment of the present invention, the process shown in the flowchart of FIG. 3 may be parallelized for speed purposes. That is, latches which do not share logic cones can be optimized by concurrent processes as long as their input and output logic cones do not share the same physical space in order to prevent a gate to be placed in a location by a processor and not seen by the optimization on another processor. According to an embodiment of the present invention, if the parallel processing is being performed, the logic cones are being analyzed and where there is a possibility of two concurrent processes competing for the same physical location, a handshaking mechanism between the processors may be implemented to find open locations. The results of each processor may then be merged into one proposed solution. According to yet another embodiment of the present invention, the method shown in FIG. 4, may be implemented such that the analysis performed on each latch to determine if latch inversion simplification is possible, may be parallelized. That is, operations 308 through 316 may be performed simultaneously on all of the latches excluding the latches having positive slack. Thus, according to this embodiment of the present invention, all latches without shared logic may be analyzed concurrently and the proposed solutions resulting from the analysis may be stored within a single processor. Afterwards, the physical implementation (in operation 318) of the proposed solutions may be performed sequentially to avoid any potential conflicts of shared physical resources.

Figure 5:
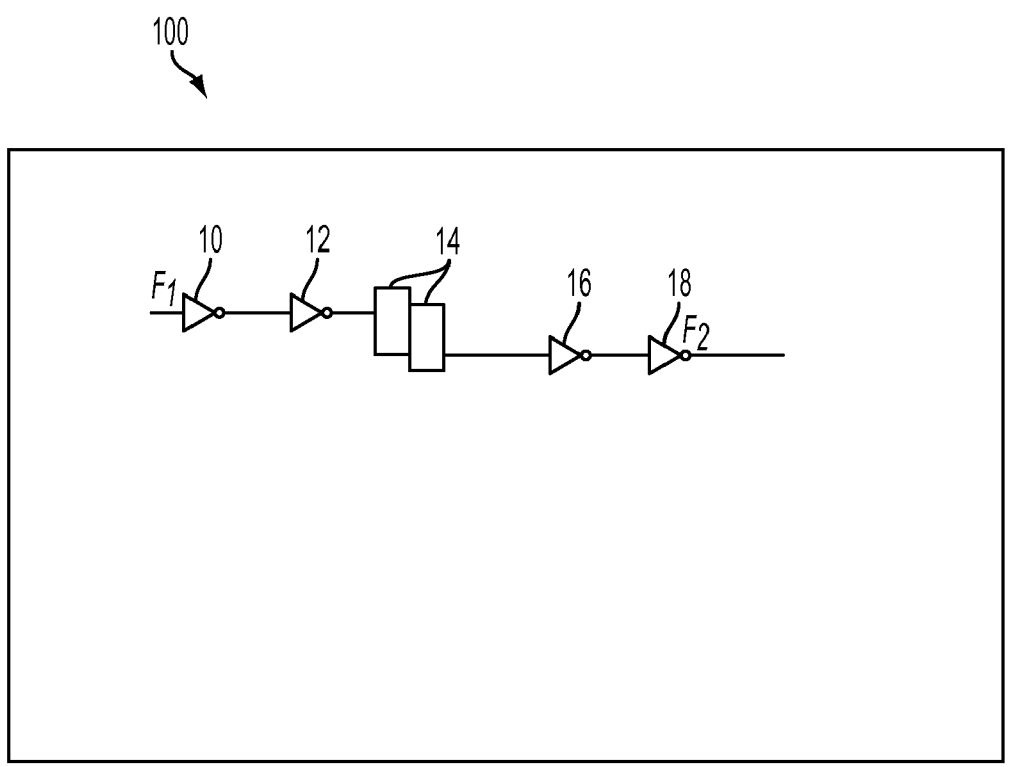
FIG. 5 is a diagram illustrating an example of a logic structure.

FIG. 5 is a diagram illustrating an example of a logic structure. As shown in FIG. 5, an example of a logic structure which may be simplified by applying the method shown as shown in FIG. 4 is provided. The logic structure 100 includes a latch path $F_1$ to $F_2$ which includes a first pair of inverters 10 and 12 at an input of a latch 14 and a second pair of inverters 16 and 18 at an output of the latch 14. Upon applying the method of FIG. 4, as mentioned above, path problems between latches are identified based on timing analysis. After review of the list of all the paths that do not meet certain timing requirements, a path is selected to be analyzed. In FIG. 5, during analysis of the selected path, for example, logic structure 100, the logic (e.g., the first pair of inverters 10 and 12 and the second pair of inverters 16 and 18) connected to an input and output of the latch 14 are reviewed to determine whether optimal changes may be made to the logic within the selected path. These optimal changes include any changes which will reduce the number of logic gates, path delay and circuit power required within the logic structure 100 within violating the timing requirements and which improves the logic structure 100 without compromising the logic function. Upon review of the logic shown in FIG. 5, extra inverters 10 and 18 are identified. These inverters 10 and 18 are considered unnecessary since the signal polarities are inverted multiple times unnecessarily. For example, if the signal polarity going into inverter 10 is "0" it is inverted to a "1" at inverter 10 and then inverted back to "0" by inverter 12 going through the latch 14 to be inverted again by inverter 16 into a "1" and then inverted again to a "0" by the inverter 18. Therefore, the logic included in the logic structure 100 is able to be simplified using DeMorgan's Theorems as described below with reference to FIG. 6 without compromising the logic function.

Figure 6:
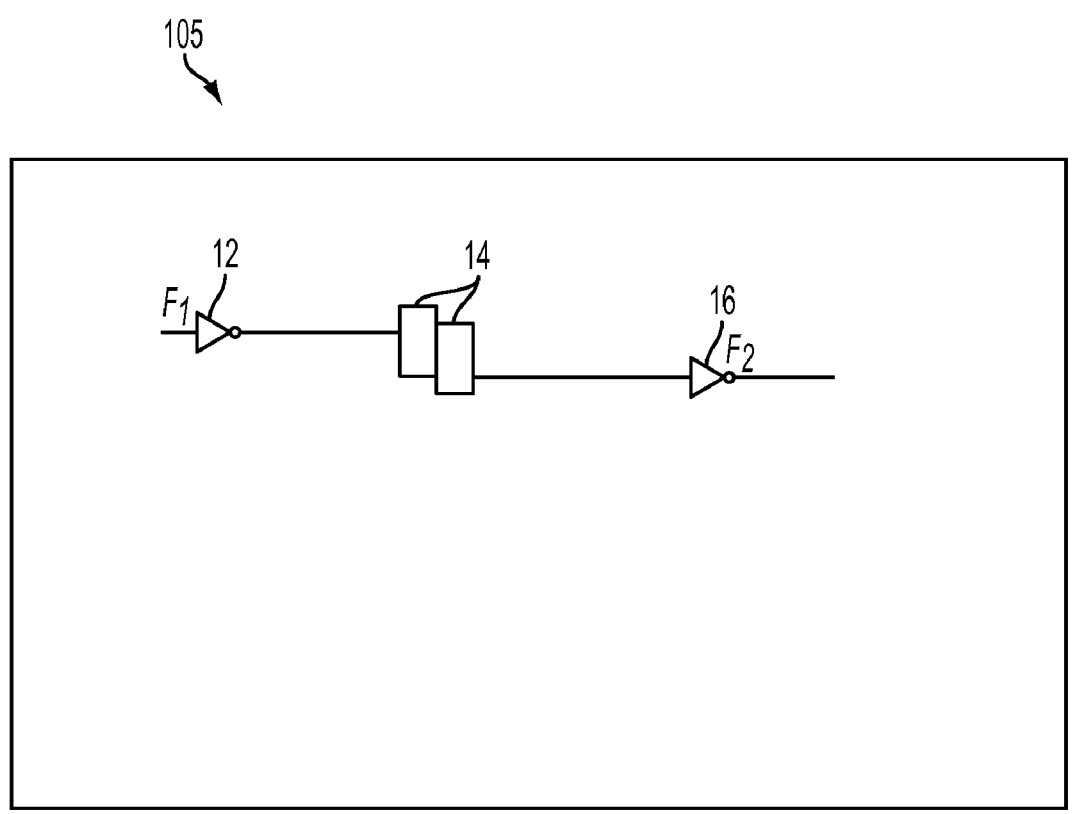
FIG. 6 is a diagram illustrating a modified logic structure of the logic structure shown in FIG. 5 upon implementing the method shown in FIG. 4.
Figure 7:
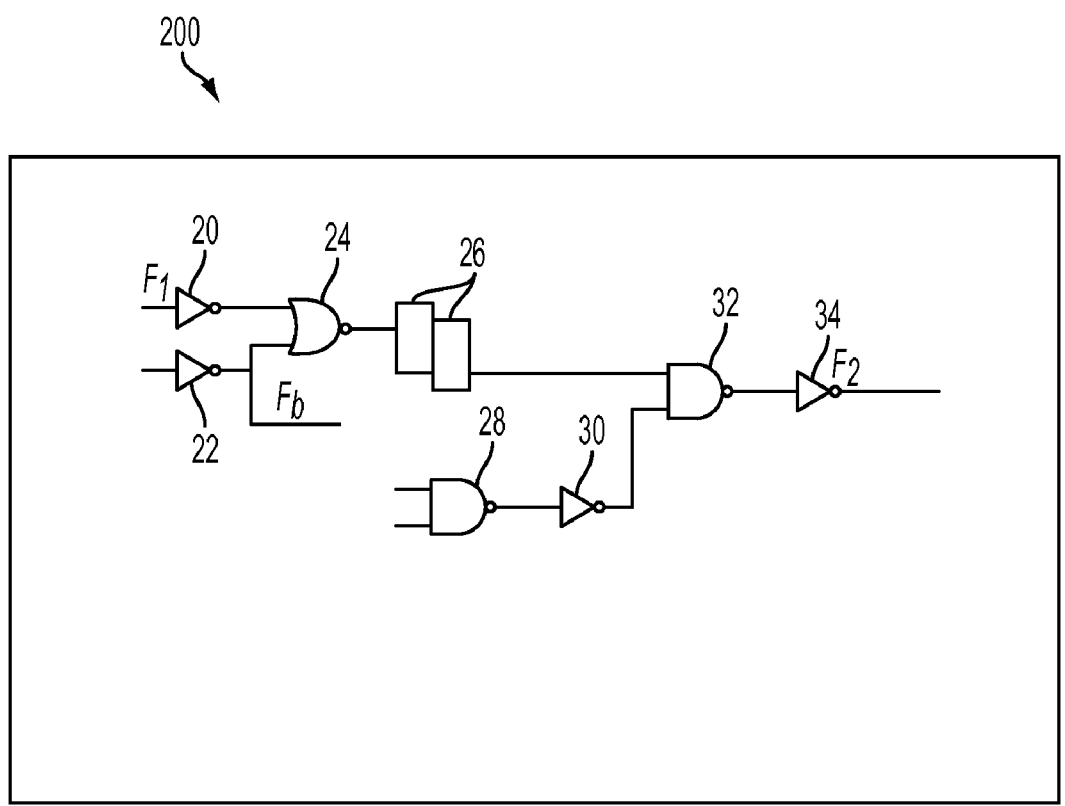
FIG. 7 is a diagram illustrating another example of a logic structure.
Figure 8:
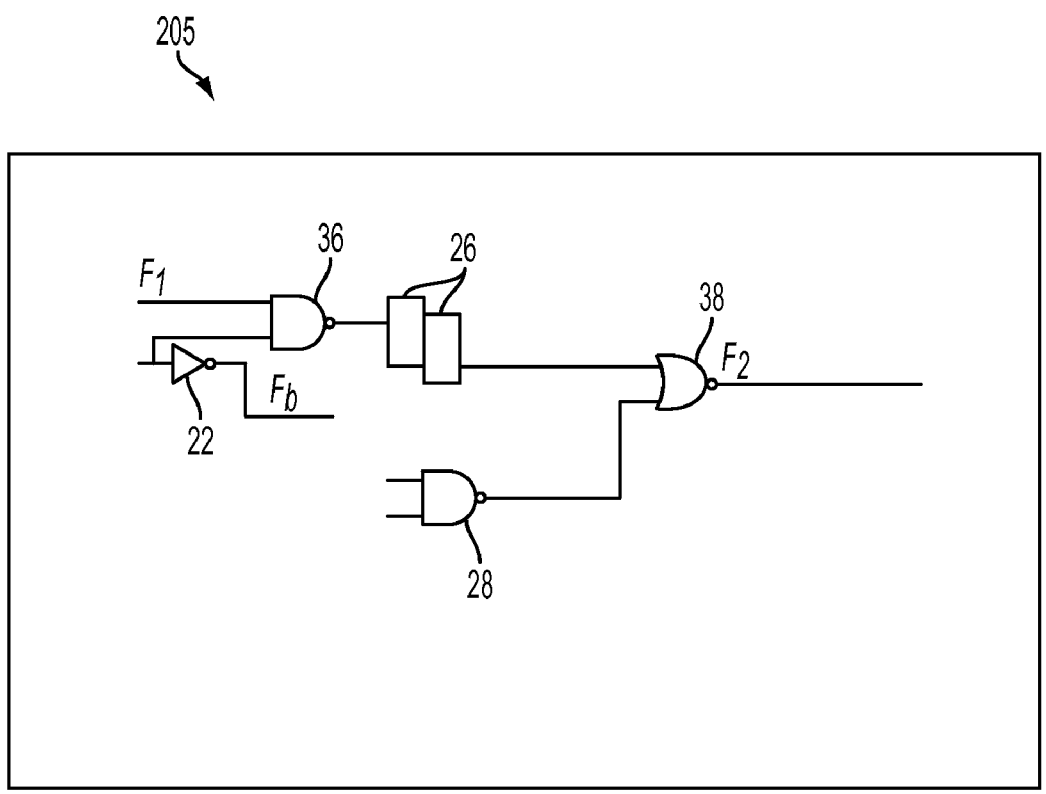
FIG. 8 is a diagram illustrating a modified logic structure of the logic structure shown in FIG. 7 upon implementing the method shown in FIG. 4.

FIG. 6 is a diagram illustrating a modified logic structure of the logic structure shown in FIG. 5 upon implementing a method shown in FIG. 4. As shown in FIG. 6, the extra inverters 10 and 18 shown in FIG. 5 have been removed. According to an embodiment of the present invention, the algorithm of the present invention will not remove any inverters (e.g., the inverters 10 and 18) from the paths that potentially can cause early-mode timing violations. As shown in FIG. 6, a modified logic structure 105 includes a latch path $F_1$ to $F_2$ which now includes the inverter 12, the latch 14 and the inverter 16. According to an embodiment of the present invention, a scan initialization logic and process may require modification based on any changes made to the logic structure 100. In addition, additional modifications may need to be made in order to meet delay and slew requirements. Next, a post processing operation is implemented which automatically modifies the logic design in HDL such that the Boolean equivalence check will pass. FIGS. 7 and 8 below illustrate another example of a logic structure and a modified version of the logic structure using the method described above. According to an embodiment of the present invention, if there are no inverters at the input or output of the latch 14 for example, logic subsets may be identified using DeMorgan's Theorems that may be substituted to perform the same logic function.

FIG. 7 is a diagram illustrating another example of a logic structure. As shown in FIG. 7, a logic structure 200 is provided. The logic structure 200 includes a latch patch from $F_1$ to $F_2$ that includes a first inverter 20 and a second inverter 22 at an input of a two-way NOR gate 24. The NOR gate 24 is positioned at an input of a latch 26. A first NAND gate 28 having a third inverter 30 at an output thereof along with an output of the latch 26 are input into a second NAND gate 32. A fourth inverter 34 is provided at an output of the second NAND gate 32.

FIG. 8 is a diagram illustrating a modified logic structure of the logic structure shown in FIG. 7 upon implementing a method as shown in FIG. 4. As shown in FIG. 8, after applying the method shown in FIG. 4, the DeMorgan's Theorems were applied to the logic before and after the latch 26. That is, these theorems were applied to the first through fourth inverters 20, 22, 30 and 34 and to the NOR gate 24 and the first and second NAND gates 28 and 32. As a result, as shown in FIG. 8, the logic structure 200 has been modified. A modified logic structure 205 is provided and only includes the second inverter 22, the NAND gate 28, another NAND gate 36, the latch 26, and an NOR gate 38. As shown in FIGS. 7 and 8, the first, third and fourth inverters 20, 30 and 34 were removed. The NOR gate 24 was replaced by an NAND gate 36 and the NAND gate 32 was replaced by a NOR gate 38. Therefore, the logic function at the input of the latch 26 changes (i.e., polarity change) however the logic function after the latch 26 is preserved therefore maintaining the logic integrity of the logic structure 200 (now modified logic structure 205). By applying the method according to an embodiment of the present invention to the logic structure 200 (as depicted in FIG. 7), the latch patch from $F_1$ to $F_2$ is reduced, incurring speed improvements thereby reducing logic and delay of the logic structure 200.

Thus, according to an embodiment of the present invention, the logic function at the input path is modified such that the modified logic function is a complement of the logic function at the input path prior to being modified and with a reversed latch output polarity the logic function at the output path remains a same logic function as the logic function at the output path prior to being modified.

According to an embodiment of the present invention, intermediate logic points in downstream logic are identified to which the logic simplification process is applied simultaneously before and after the latch. In addition, upstream logic points (before the latch) are identified to allow logic simplification. While the logic function at the input of a latch such as latch 26 may change, the logic integrity of any other connection of the upstream logic is maintained. For example, the logic function of $F_b$ shown in FIG. 8 is preserved.

Figure 9:
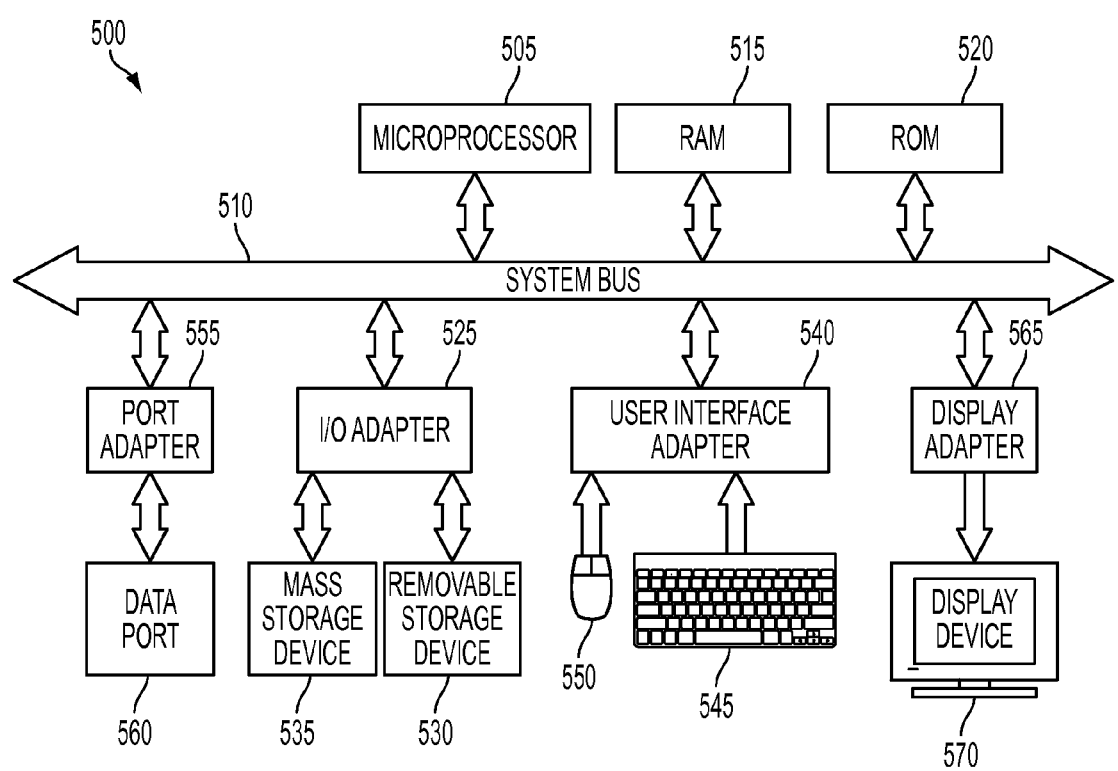
FIG. 9 is a diagram illustrating general purpose computer for implementing the method shown in FIG. 4 that can be implemented within embodiments of the present invention.

FIG. 9 is a diagram illustrating an apparatus for implementing the method shown in FIG. 4 that can be implemented within embodiments of the present invention. As shown in FIG. 9, the method described herein is practiced with a general-purpose computer and the method may be coded as a set of instructions on removable or hard media for use by the general-purpose computer. In FIG. 9, a computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

In view of the above, the present method embodiment may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above.

Embodiments of the present invention provide a method for automation of logic synthesis which reduces the number of logic gates, path delay and circuit power required within a logic design. In addition, the present invention prevents any timing violations and automatically changes the polarity of a latch when it is determined that a different latch polarity will improve the logic design without compromising the logic function. Therefore, the present invention provides the advantage of being able to back annotate the VHDL if necessary to reflect any changes in latch polarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer-implemented method for reducing logic and delay within a logic structure in a circuit the method comprising:
    searching, by using a computer, logic structures to be analyzed;
    finding a plurality of latches within a logic structure to be analyzed;
    determining if any respective latches of the plurality of latches have sufficiently positive slack within an input and output path thereof and optionally excluding the respective latches from being analyzed;
    when there is at least one remaining latch to be analyzed, determining whether inverters are disposed within an input path and an output path of the at least one remaining latch;
    obtaining logic functions of the input path and output path of the at least one remaining latch when inverters are found;
    modifying the logic functions using DeMorgan's Theorems, wherein the modifying simplify the logic functions;
    determining whether timing violations exist with the modified logic functions; and
    annotating hardware description language based on the modified logic functions when no timing violations exist; and
    wherein modifying the logic functions using Demorgan's Theorems comprises modifying the logic function at the input path such that the modified logic function is a complement of the logic function at the input path prior to being modified and with a reversed latch output polarity the logic function at the output path remains a same logic function as the logic function at the output path prior to being modified.

2. The computer-implemented method of claim 1, wherein determining whether inverters are disposed within the input path and the output path of the at least one remaining latch comprises:
    tracing backwards the input path from an input at the at least one remaining latch and searching for inverters along the input path; and
    tracing forward the output path from an output of the at least one remaining latch and searching for inverters along the output path.

3. The computer-implemented method of claim 2, wherein tracing backwards the input path and tracing forward the output path are performed simultaneously.

4. The computer-implemented method of claim 2, wherein tracing backwards the input path and tracing forward the output path are performed sequentially.

5. The computer-implemented method of claim 1, wherein modifying the logic functions is performed simultaneously.

6. The computer-implemented method of claim 1, wherein modifying the logic functions is performed sequentially.

7. The computer-implemented method of claim 1, further comprising:
    determining whether a physical implementation of the modified logic functions at the input and output paths meets desired specifications;
    removing previous logic functions and inputting, routing and connecting the modified logic functions when it is determined that the desired specifications are met.

8. The computer-implemented method of claim 7, further comprising:
    optimizing gates within the logic structure that are affected by the modified logic functions by adjusting a power level thereof; and
    checking for failures on affected signals within the logic structure.

9. The computer-implemented method of claim 1, wherein determining whether timing violations exist comprises:
    restoring the at least one remaining latch of the logic structure to an original state thereof when it is determined that timing violations exist.

10. The computer-implemented method of claim 1, wherein when there are at least two remaining latches to be analyzed, the method further comprises analyzing the at least two remaining latches using parallel processing.

11. The computer-implemented method of claim 1, wherein when there are at least two remaining latches to be analyzed, the method further comprises analyzing the at least two remaining latches simultaneously and storing any modified logic functions resulting from analyzing in a single processor and physically implementing the modified logic functions sequentially.

12. The computer-implemented method of claim 1, wherein annotating the hardware description language based on the modified logic functions is performed when the at least one remaining latch has been inverted.

13. A computer program product comprising a non-transitory computer useable medium including a computer readable program, wherein the computer readable program when executed on a computer causes the computer to implement a method for reducing logic and delay within a logic structure in a circuit, the method comprising:
    searching, by using a computer, logic structures to be analyzed;
    finding a plurality of latches within a logic structure to be analyzed;
    determining if any respective latches of the plurality of latches have sufficiently positive slack within an input and output path thereof and optionally excluding the respective latches from being analyzed;
    when there is at least one remaining latch to be analyzed, determining whether inverters are disposed within an input path and an output path of the at least one remaining latch;
    obtaining logic functions of the input path and output path of the at least one remaining latch when inverters are found;

modifying the logic functions using DeMorgan's Theorems, wherein the modifying simplify the logic functions;

determining whether timing violations exist; and annotating hardware description language based on the modified logic functions when no timing violations exist; and wherein modifying the logic functions using DeMorgan's Theorems comprises modifying the logic function at the input path such that the modified logic function is a complement of the logic function at the input path prior to being modified and with a reversed latch output polarity the logic function at the output path remains a same logic function as the logic function at the output path prior to being modified.

14. The computer program product of claim 13, wherein determining whether inverters are disposed within the input path and the output path of the at least one remaining latch comprises:
    tracing backwards the input path from an input at the at least one remaining latch and searching for inverters along the input path; and
    tracing forward the output path from an output of the at least one remaining latch and searching for inverters along the output path.

15. The computer program product of claim 14, wherein tracing backwards the input path and tracing forward the output path are performed simultaneously.

16. The computer program product of claim 14, wherein tracing backwards the input path and tracing forward the output path are performed sequentially.

17. The computer program product of claim 13, wherein modifying the logic functions is performed simultaneously.

18. The computer program product of claim 13, wherein modifying the logic functions is performed sequentially.

19. The computer program product of claim 13, the method further comprising:
    determining whether a physical implementation of the modified logic functions at the input and output paths meets desired specifications;
    removing previous logic functions and inputting, routing and connecting the modified logic functions when it is determined that the desired specifications are met.

20. The computer program product of claim 19, the method further comprising:
    optimizing gates within the logic structure that are affected by the modified logic functions by adjusting a power level thereof; and
    checking for failures on affected signals within the logic structure.

21. The computer program product of claim 13, wherein determining whether timing violations exist comprises:
    restoring the at least one remaining latch of the logic structure to an original state thereof when it is determined that timing violations exist.

22. The computer program product of claim 13, wherein when there are at least two remaining latches to be analyzed, the method further comprises analyzing the at least two remaining latches using parallel processing.

23. The computer program product of claim 13, wherein when there are at least two remaining latches to be analyzed, the method further comprises analyzing the at least two remaining latches simultaneously and storing any modified logic functions resulting from analyzing in a single processor and physically implementing the modified logic functions sequentially.

* * * * *